United States Patent
Wu et al.

(10) Patent No.: US 9,624,090 B2
(45) Date of Patent: Apr. 18, 2017

(54) MIRCO-ELECTRO-MECHANICAL SYSTEM DEVICE

(71) Applicants: Chia-Yu Wu, Kaohsiung (TW); Chiung-Cheng Lo, Miaoli (TW)

(72) Inventors: Chia-Yu Wu, Kaohsiung (TW); Chiung-Cheng Lo, Miaoli (TW)

(73) Assignee: RICHTEK TECHNOLOGY CORPORATION, Zhubei, Hsinchu (TW)

(*) Notice: Subject to any disclaimer, the term of this patent is extended or adjusted under 35 U.S.C. 154(b) by 0 days.

(21) Appl. No.: 14/728,153

(22) Filed: Jun. 2, 2015

(65) Prior Publication Data
US 2016/0257557 A1    Sep. 8, 2016

(30) Foreign Application Priority Data
Mar. 5, 2015 (TW) .............................. 104106958 A

(51) Int. Cl.
*B81B 3/00* (2006.01)

(52) U.S. Cl.
CPC .......... *B81B 3/0051* (2013.01); *B81B 3/0027* (2013.01); *B81B 2203/04* (2013.01)

(58) Field of Classification Search
CPC .. B81B 3/0051; B81B 2203/04; B81B 3/0027
USPC ........................................................ 257/415
See application file for complete search history.

(56) References Cited

U.S. PATENT DOCUMENTS

| | | | |
|---|---|---|---|
| 6,892,576 B2 | 5/2005 | Samuels et al. | |
| 8,393,215 B2 | 3/2013 | Stahl et al. | |
| 2009/0320596 A1* | 12/2009 | Classen | G01P 15/125 73/514.32 |
| 2012/0081598 A1* | 4/2012 | Calvet | B81B 3/0037 348/357 |
| 2013/0214367 A1* | 8/2013 | van der Heide | H01L 29/84 257/415 |

* cited by examiner

*Primary Examiner* — Fernando L Toledo
*Assistant Examiner* — Adam S Bowen
(74) *Attorney, Agent, or Firm* — Tung & Associates

(57) ABSTRACT

The invention provides a micro-electro-mechanical system device including: a substrate; a proof mass, including an outer frame which inwardly defines an internal space, and at least one inner extension portion which is directly connected to the outer frame and inwardly extends from the outer frame; at least one compliant structure, located in the internal space, and directly connected to the corresponding inner extension portion; an anchor, located in the internal space and directly connected to the at least one compliant structure, the anchor being connected to the substrate; movable electrodes, located in the internal space and connected to the proof mass; and fixed electrodes, respectively located in correspondence to the movable electrodes, and being connected to the substrate through fixing portions.

10 Claims, 8 Drawing Sheets

MIRCO-ELECTRO-MECHANICAL SYSTEM DEVICE

CROSS REFERENCE

The present invention claims priority to TW 104106958, filed on Mar. 5, 2015.

BACKGROUND OF THE INVENTION

Field of Invention

The present invention relates to a micro-electro-mechanical system (MEMS) device, in particular a MEMS device including a proof mass with an inner extension portion, whereby the MEMS device has a higher sensitivity but does not require a linkage.

Description of Related Art

MEMS devices are commonly used nowadays, and one common application of the MEMS device is for motion sensing. FIG. 1 shows a prior art MEMS device 10 disclosed by U.S. Pat. No. 6,892,576, wherein only one fourth of the MEMS device 10 is shown in the figure (the MEMS device 10 has a symmetric structure). The proof mass 11 is connected to a substrate (not shown) through springs 12, linkages 13, and anchors 14. The linkages 13 are connected to the substrate by multiple anchors 14, for avoiding distortion of the linkages 13. In this prior art, the linkages 13 which are provided for connecting the springs 12 occupy a large area, so the boundary size of the proof mass 11 needs to increase to obtain the required mass quantity. Hence, the MEMS device 10 needs a larger area and its size can not be reduced. Further, the structure of multiple anchors also increases the complexity of the manufacturing process.

FIG. 2 shows another prior art MEMS device 20 disclosed by U.S. Pat. No. 8,393,215, wherein a proof mass 21 is connected to a substrate 25 through springs 22, linkages 23, and anchors 23. The linkages 23 for connecting the springs 22 occupy a large area, so the boundary size of the proof mass 11 needs to increase to obtain the required mass quantity. Besides the aforementioned demerits, the lengths of the linkages 23 may deviate due to thermal deformation, and this may cause an offset of the proof mass to seriously affect the accuracy of the device.

In view of the demerits of the prior art, the present invention provides a MEMS device having at least one inner extension portion instead of linkages, to increase the sensitivity of the device.

SUMMARY OF THE INVENTION

In one perspective, the present invention provides a MEMS device including: a substrate; a proof mass, including an outer frame and at least one inner extension portion, the outer frame inwardly defining an internal space, the inner extension portion being directly connected to the outer frame and inwardly extending from the outer frame; at least one compliant structure, located in the internal space, the at least one compliant structure being directly connected to the corresponding inner extension portion; an anchor, located in the internal space and directly connected to the at least one compliant structure, the anchor being connected to the substrate; a plurality of movable electrodes, located in the internal space and connected to the proof mass; and a plurality of fixed electrodes, respectively located in correspondence to the movable electrodes, and connected to the substrate through a plurality of fixing portions.

In one embodiment, the anchor is located at a geometric center or a mass center of the proof mass.

In one embodiment, the anchor is located in a distance to a mass center of the proof mass.

In one embodiment, the movable electrodes and the fixed electrodes includes: at least one movable electrode and at least one fixed electrode located along a first direction to sense a movement in the first direction, and at least another movable electrode and at least another fixed electrode located along a second direction to sense a movement in the second direction, wherein the first direction and the second direction are not parallel to each other.

In one embodiment, the movable electrodes and the fixed electrodes form one or more pairs of differential capacitors.

In one embodiment, the movable electrodes are connected to the at least one inner extension portion, or the outer frame; or the movable electrodes are connected to and between the at least one inner extension portion and the outer frame.

In one embodiment, the movable electrodes are located at two sides of the at least one inner extension portions, and the fixed electrodes are located at two sides of the at least one inner extension portions in correspondence to the movable electrodes.

In one embodiment, the MEMS device further includes: a plurality of middle movable electrodes and a plurality of middle fixed electrodes, the middle movable electrodes being connected to the proof mass, wherein the middle movable electrodes are located at two sides of the anchor, and the middle fixed electrodes are correspondingly located at two sides of the anchor in correspondence to the middle movable electrodes.

In one embodiment, a number of the at least one compliant structure is an even number, and the compliant structures respectively connect a corresponding even number of inner extension portions to the anchor.

The objectives, technical details, features, and effects of the present invention will be better understood with regard to the detailed description of the embodiments below, with reference to the drawings.

DESCRIPTION OF THE PREFERRED EMBODIMENTS

The drawings as referred to throughout the description of the present invention are for illustrative purpose only, o show the interrelations between the components, but not drawn according to actual scale.

Figure 1:
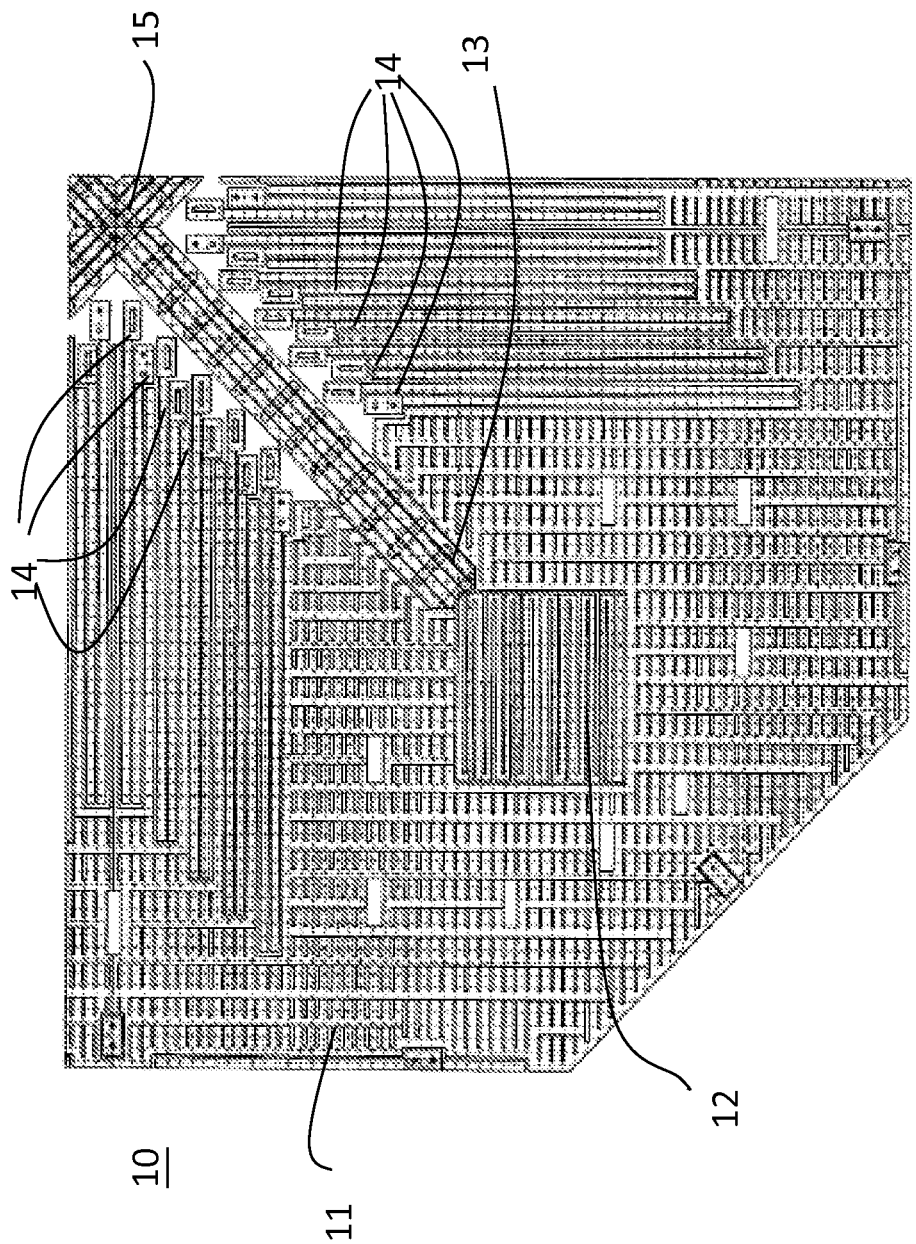
FIGS. 1 and 2 show two prior art MEMS devices.
Figure 2:
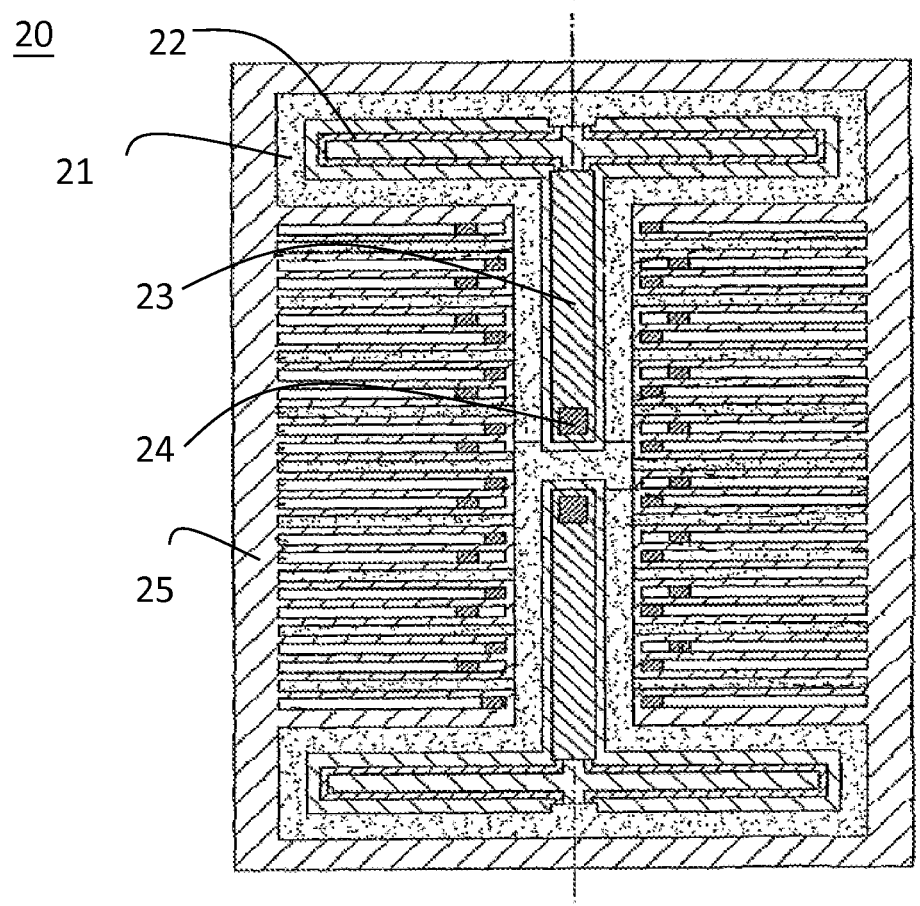
Figure 3:
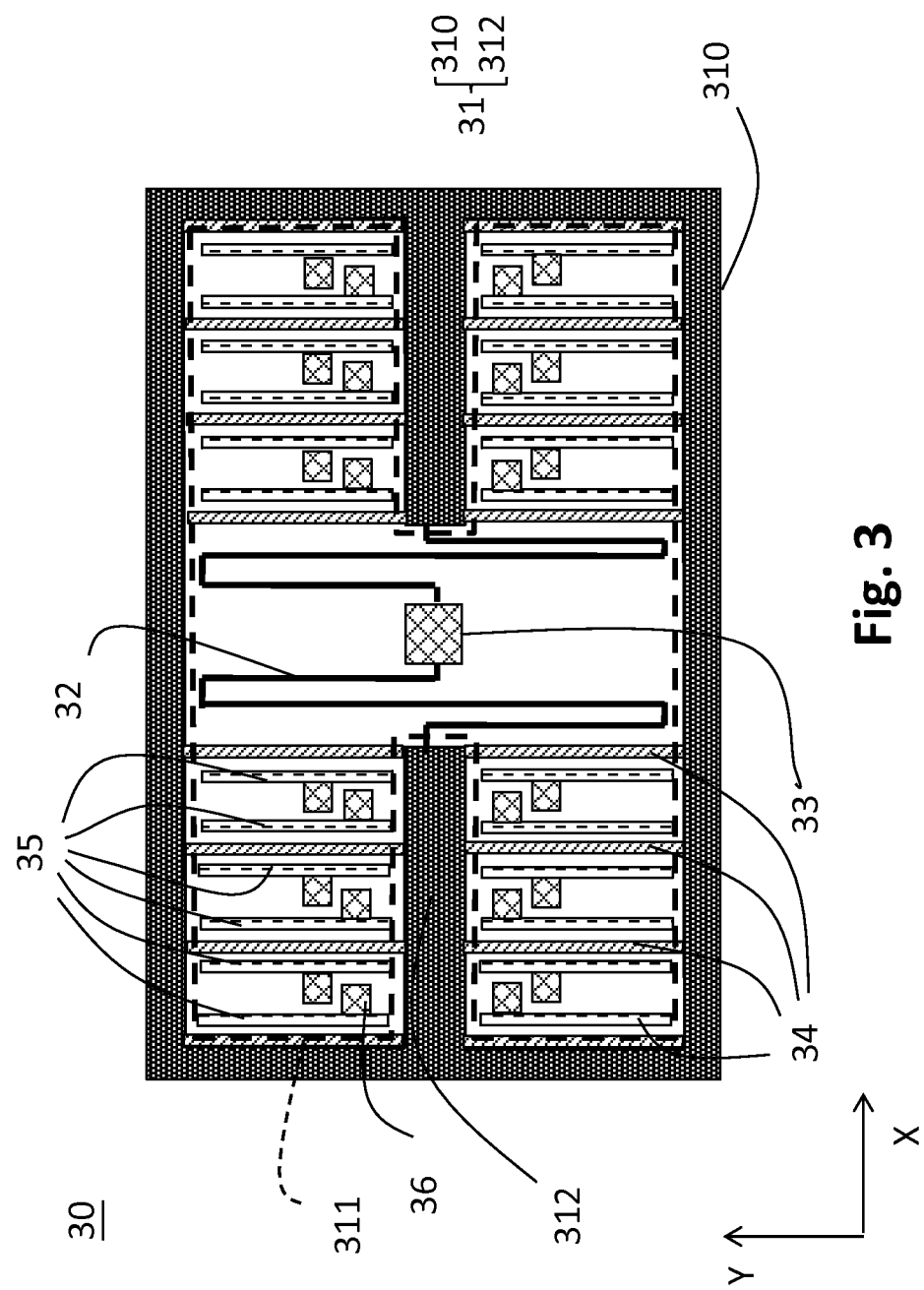
FIGS. 3-8 show MEMS devices according to several embodiments of the present invention.

FIG. 3 shows a MEMS device 30 according to one perspective of the present invention. The MEMS device 30 includes: a substrate (located under the structure shown in the figure); a proof mass 31, including an outer frame 310 and at least one inner extension portion 312, the outer frame 310 inwardly defining an internal space 311, the inner extension portion 312 being directly connected to the outer frame 310 and inwardly extending from the outer frame 310 (note that the inner extension portion 312 is a portion of the proof mass 31 so it increases the mass quantity of the proof mass 31); at least one compliant structure 32, which in one embodiment can be embodied as a spring, located in the internal space 311, the at least one spring 32 being directly connected to the corresponding inner extension portion 312;

an anchor 33, located in the internal space 311 and directly connected to the at least one spring 32, the anchor 33 being further connected to the substrate; plural movable electrodes 34, located in the internal space 311 and connected to the proof mass 31; and plural fixed electrodes 35, respectively located in correspondence to the movable electrodes 34, the fixed electrodes 35 being connected to the substrate through plural fixing portions 36. The relative movement between the fixed electrodes 35 and the movable electrodes 34 causes a change in the capacitances between the fixed electrodes 35 and the movable electrodes 34, which can be used for sensing, e.g. acceleration.

In the shown embodiment, one side of each movable electrode 34 is connected to the outer frame 310, and the other side of each movable electrode 34 is connected to the inner extension portion 312. However, this is not necessary. In another embodiment, each movable electrode 34 can have only one side connected to the outer frame 310 or the inner extension portion 312, and the other side is left open.

In the shown embodiment, the anchor 33 is located at a geometric center of the proof mass 31; however, the location of the anchor 33 is not limited to the geometric center. In another embodiment, the anchor 33 is located at a mass center of the proof mass 31 (the mass center is not the geometric center when a mass of the proof mass 31 is not evenly distributed). In yet another embodiment, there is a distance between the anchor and the mass center of the proof mass, such that the proof mass can perform an eccentric movement caused by this distance (please refer to FIG. 7).

The number of the anchor 33 is preferably but not limited to one. In one embodiment, the number can be more if necessary; for example, the two springs 32 can be respectively connected to two anchors (not shown).

Figure 4:
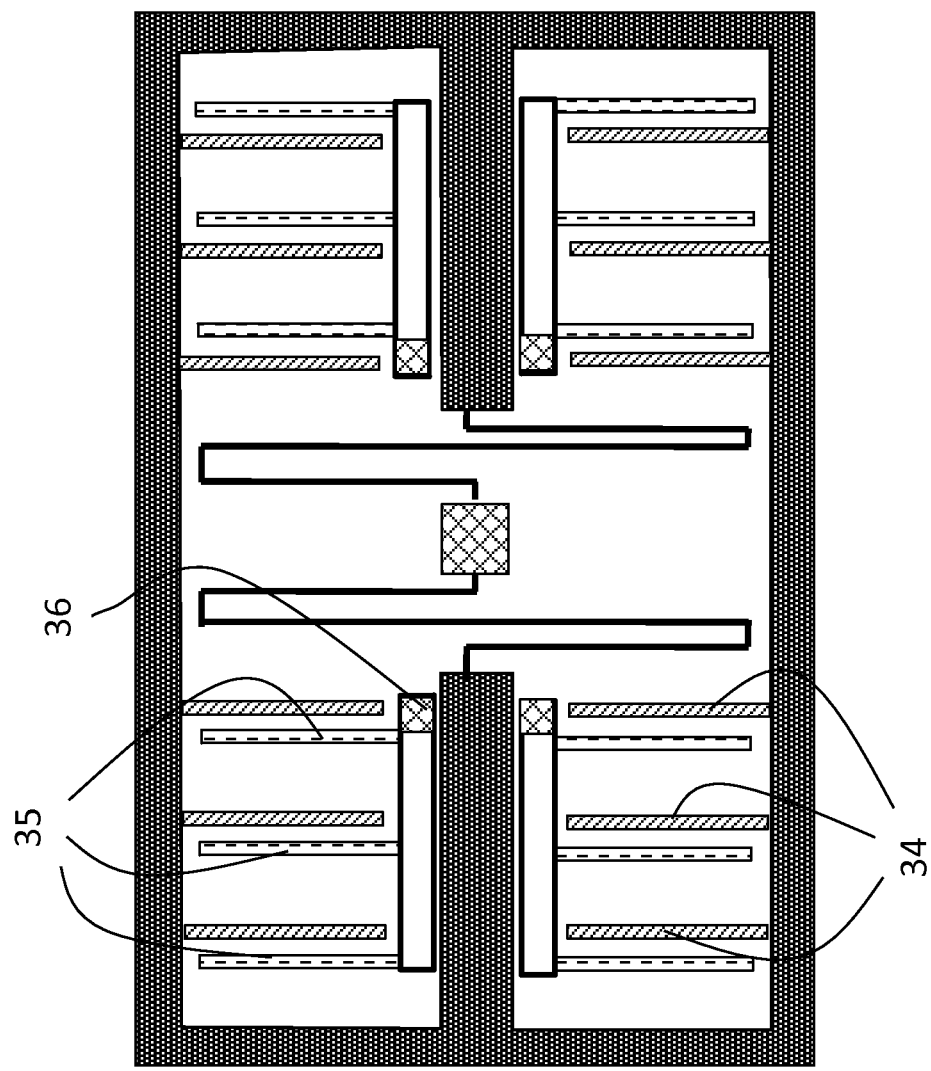

In the aforementioned embodiment, as shown in FIG. 3, each fixed electrode 35 is individually connected to the substrate through one fixing portion 36. FIG. 4 shows another MEMS device 40 according to another embodiment, wherein two or more fixed electrodes 35 are connected to the substrate through one fixing portion 36. Preferably, as shown in FIGS. 3 and 4, the fixing portions 36 is preferably connected to the fixed electrodes at locations where the fixed electrodes are closer to the mass center of the proof mass 31, such that the structure is less impacted by stress.

In the aforementioned embodiment, the internal space 311 is one continuous and sealed (in 2-dimension) structure. However, in another embodiment, the internal space can include plural discontinuous structures; for example, the internal space 311 is divided into several discontinuous structures, or a portion of the proof mass 31 separates the internal space 311 into plural individual spaces. In yet another embodiment, the internal space 311 can be a semi-open structure; for example, the outer frame 310 includes an opening to connect the internal space 310 to outside of the outer frame 310.

Figure 5:
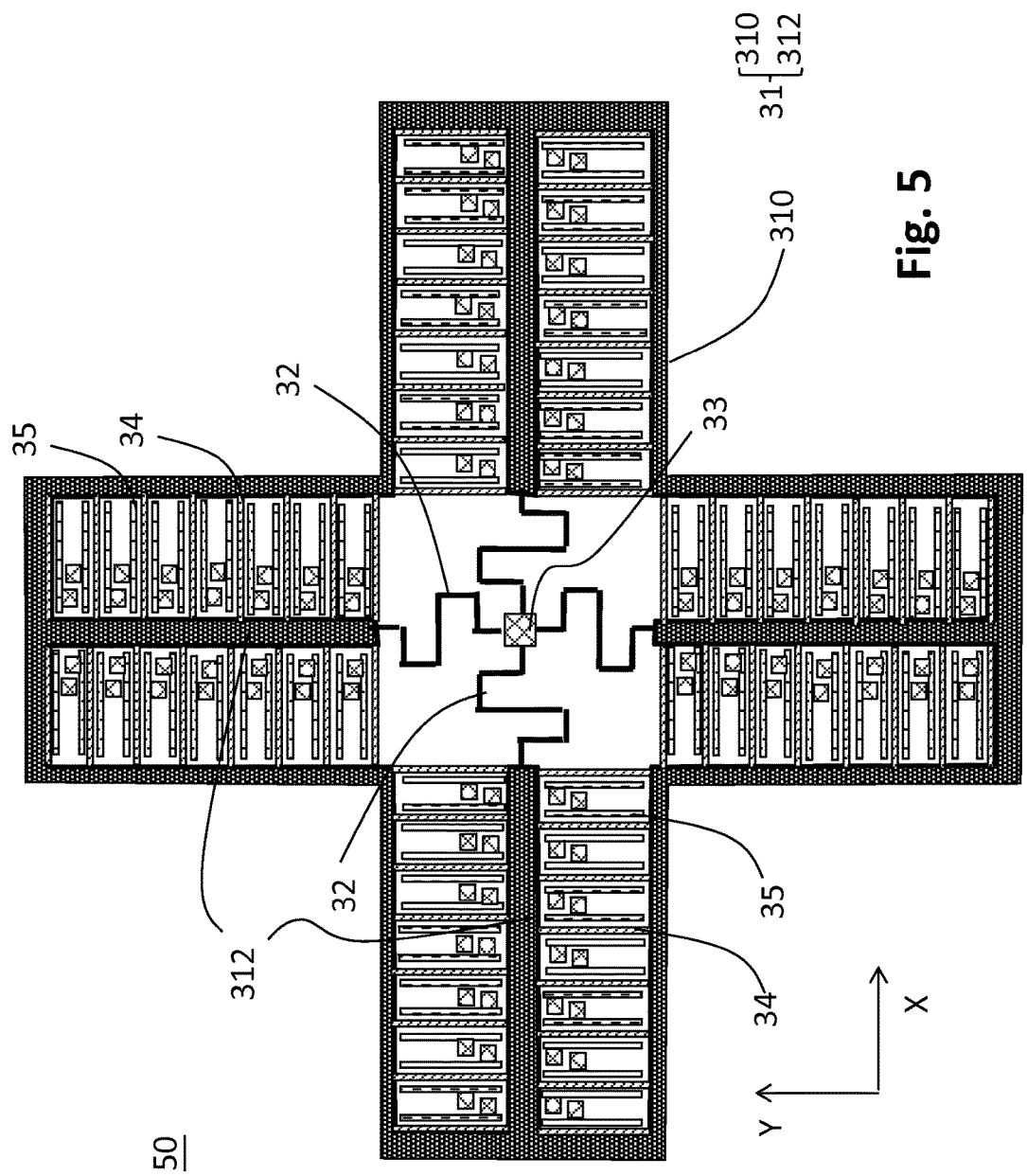

FIG. 5 shows a MEMS device 50 according to another embodiment of the present invention. The MEMS device 50 includes, in addition to movable electrodes 34 and fixed electrodes 35 located along a first direction (for example, direction X) to sense a movement in the first direction, movable electrodes 34 and fixed electrodes 35 located along a second direction (for example, direction Y) to sense a movement in the second direction, wherein the first direction and the second direction are not parallel to each other. In the shown embodiment, the MEMS device 50 has a symmetric structure; however, the present invention is not limited to a symmetric structure and can have an asymmetric structure. Further, it is not necessary for all the springs to be connected to one same anchor 33. For example, there maybe plural anchors and some of the springs can be connected to different anchors. And, in another embodiment, plural springs can be connected together and then connected to one or more anchors. For example, the proof mass is connected to a first spring for assisting a movement in a first dimension (such as the X-direction); the first spring is further connected to a second spring for assisting a movement in a second dimension (such as the Y-direction); and the second spring is further connected to one or more anchors.

In one embodiment, the movable electrodes and the fixed electrodes form one or more pairs of differential capacitors. For example, in the MEMS device 30 shown in FIG. 3, two adjacent fixed electrodes 35 are located between two movable electrodes 34 to form a pair of differential capacitors. When there is a movement, the gap between one fixed electrode 35 and one movable electrode 34 increases, and the gap between the other fixed electrode 35 and the other movable electrode 34 decreases. For another example, in the MEMS device 40 shown in FIG. 4, at the left side, the fixed electrodes 35 are at the left side of the corresponding movable electrodes 34; at the right side, the fixed electrodes 35 are at the left side of the movable electrodes 34, so multiple pairs of differential capacitors are formed because the gaps between the fixed electrode 35 and the movable electrode 34 at the left side and the right side of the MEMS device 40 change differently when there is a movement.

Figure 6:
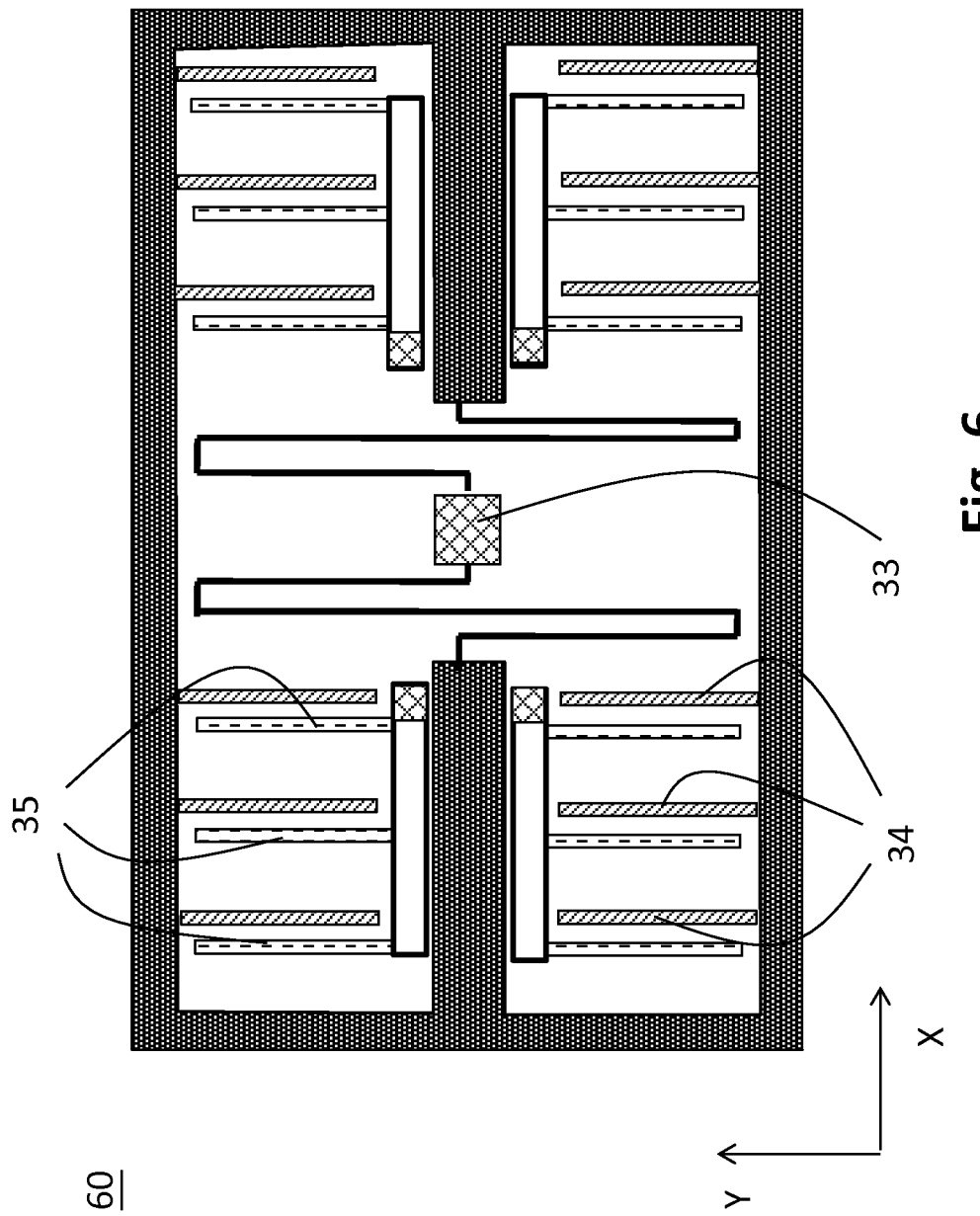

However, the differential capacitor is not a must design according to the present invention. Please refer to the MEMS device 60 (FIG. 6), which includes none of the differential capacitors therein. At the left and right sides, the gaps between the fixed electrodes 35 and the movable electrodes 34 increase (or decrease) all in the same way.

Figure 7:
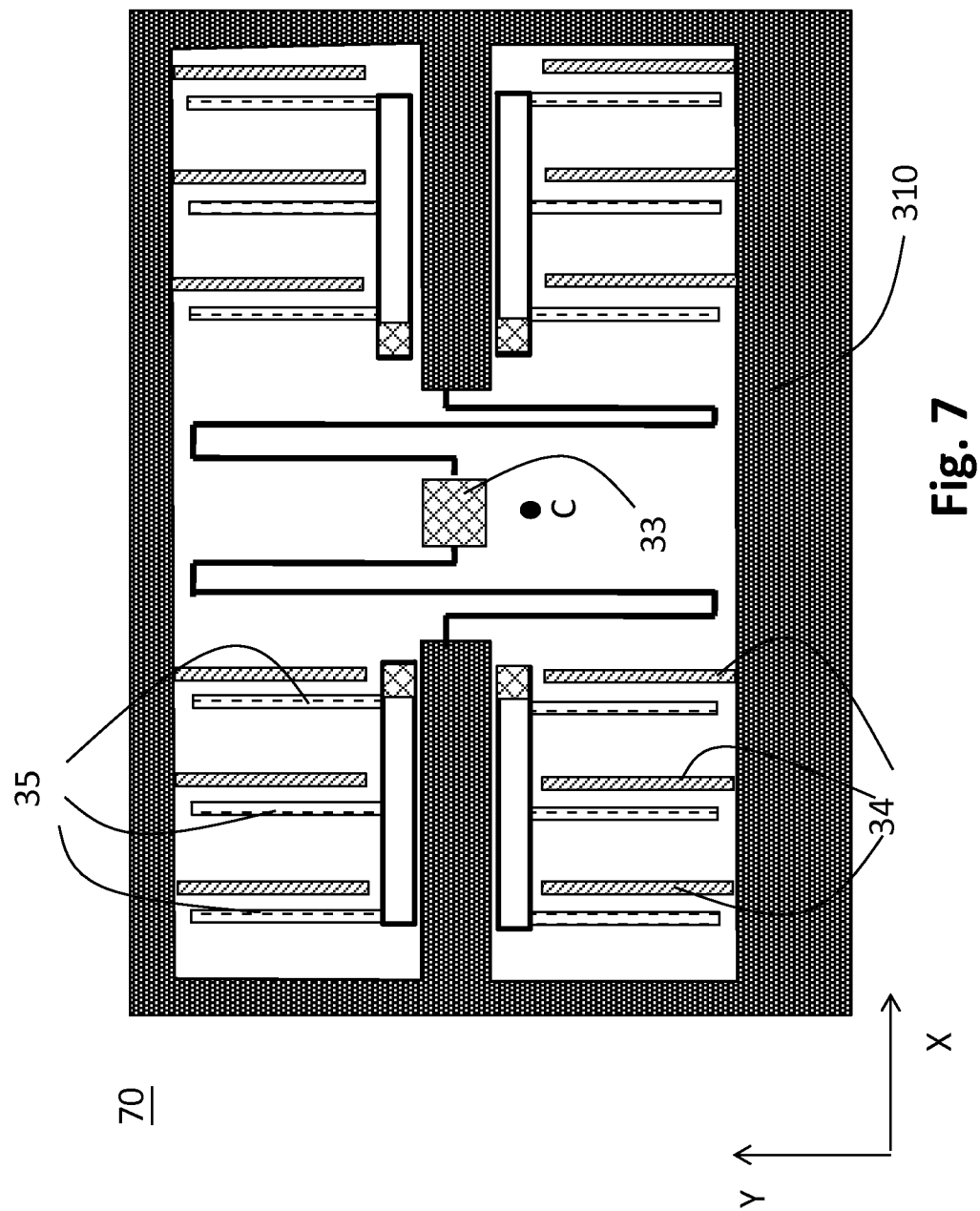

Referring to the embodiment as shown in FIG. 7, there is a distance between the anchor 33 and a mass center C of the proof mass (a distance in direction Y). By this distance, the proof mass can swing, causing the gaps between the fixed electrodes 35 and the movable electrodes 34 at the left and right sides to change differently to provide a differential capacitor effect. Note that the outer frame has a larger mass portion at its lower side as shown in FIG. 7, so the mass center C is not located at the geometric center.

Figure 8:
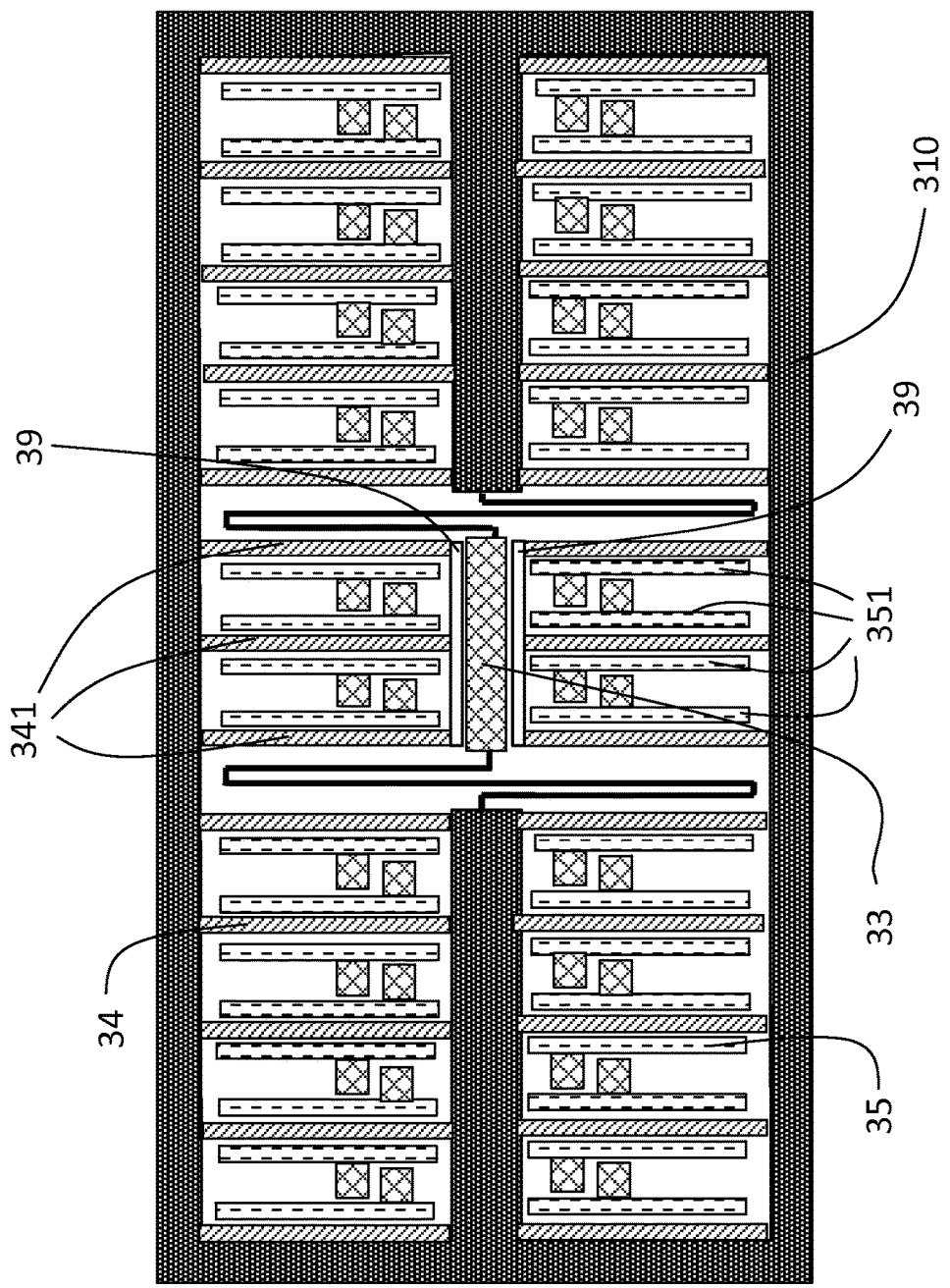

In the embodiment shown in FIG. 3, the movable electrodes 34 and the fixed electrodes 35 are located at two sides of the inner extension portions 312, and the movable electrodes 34 are located between and connected to the outer frame 310 and the inner extension portions 312. FIG. 8 shows a MEMS device 80 according to another embodiment of the present invention, wherein the MEMS device 80 further includes plural middle movable electrodes 341 and plural middle fixed electrodes 351. One side of each middle movable electrode 341 is connected to the outer frame 310, and the other side of each middle movable electrode 341 can be left open (connected to nothing) in one embodiment, or, as shown in FIG. 8, the other side of each middle movable electrode 341 can be connected to a connecting portion 39. Besides, this embodiment of FIG. 8 also shows that the dimension of the anchor 33 can be modified according to practical need; for example, the anchor 33 can extend in a direction toward the inner extension portions 312.

In comparison with the prior art MEMS devices, the MEMS device according to the present invention does not require any linkage; the inner extension portions are directly connected to the springs and the springs are directly connected to the anchor. The inner extension portion is a portion of the proof mass, so for the same device area, the proof mass according to the present invention can have more mass quantity than the prior art MEMS devices, and the sensitivity is improved. Or, if the sensitivity is the same, the overall device area of the present invention can be reduced as compared with the prior art MEMS devices. Further, because the present invention does not include a linkage, the negative influence due to linkage deformation by stress can be eliminated.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention; for example, the outer frame is not limited to a rectangular shape and can be any shape or layout. Or, for another example, referring to FIG. 5, movable electrodes and fixed electrodes for sensing a movement in direction Z can be arranged at the upper left, upper right, lower left, and/or lower right corners outside the MEMS device 50. Besides, an embodiment or a claim of the present invention does not need to attain or include all the objectives, advantages or features described in the above. The abstract and the title are provided for assisting searches and not to be read as limitations to the scope of the present invention.

What is claimed is:

1. A micro-electro-mechanical system (MEMS) device, comprising:
   a substrate;
   a proof mass, including an outer frame and at least one inner extension portion, the outer frame inwardly defining an internal space, the inner extension portion being directly connected to the outer frame and inwardly extending from the outer frame, wherein the inner extension portion and the outer frame are one integral piece such that the inner extension portion and the outer frame have the same motion in the same direction when the proof mass moves;
   at least one compliant structure, located in the internal space, the at least one compliant structure being directly connected to the corresponding inner extension portion;
   an anchor, located in the internal space and directly connected to the at least one compliant structure which assists a motion of the proof mass relative to the anchor, the anchor being connected to the substrate;
   a plurality of movable electrodes, located in the internal space and connected to the proof mass; and
   a plurality of fixed electrodes, respectively located in correspondence to the movable electrodes, and connected to the substrate through a plurality of fixing portions.

2. The MEMS device of claim 1, wherein the anchor is located at a geometric center or a mass center of the proof mass.

3. The MEMS device of claim 1, wherein the anchor is located in a distance to a mass center of the proof mass.

4. The MEMS device of claim 1, wherein the movable electrodes and the fixed electrodes includes: at least one movable electrode and at least one fixed electrode located along a first direction to sense a movement in the first direction, and at least another movable electrode and at least another fixed electrode located along a second direction to sense a movement in the second direction, wherein the first direction and the second direction are not parallel to each other.

5. The MEMS device of claim 1, wherein the movable electrodes and the fixed electrodes form one or more pairs of differential capacitors.

6. The MEMS device of claim 1, wherein the movable electrodes are connected to the at least one inner extension portion, or the outer frame; or the movable electrodes are connected to and between the at least one inner extension portion and the outer frame.

7. The MEMS device of claim 1, wherein the movable electrodes are located at two sides of the at least one inner extension portions, and the fixed electrodes are located at two sides of the at least one inner extension portions in correspondence to the movable electrodes.

8. The MEMS device of claim 1, further comprises: a plurality of middle movable electrodes and a plurality of middle fixed electrodes, the middle movable electrodes being connected to the proof mass, wherein the middle movable electrodes are located at two sides of the anchor, and the middle fixed electrodes are correspondingly located at two sides of the anchor in correspondence to the middle movable electrodes.

9. The MEMS device of claim 1, wherein a number of the at least one compliant structure is an even number, and the compliant structures respectively connect a corresponding even number of inner extension portions to the anchor.

10. The MEMS device of claim 9, wherein the even number of compliant structures are two compliant structures or four compliant structures.

* * * * *